(12) United States Patent
Iwamoto

(10) Patent No.: US 8,872,409 B2
(45) Date of Patent: Oct. 28, 2014

(54) METHOD FOR MANUFACTURING COMPOSITE PIEZOELECTRIC SUBSTRATE AND PIEZOELECTRIC DEVICE

(75) Inventor: Takashi Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 317 days.

(21) Appl. No.: 13/091,167

(22) Filed: Apr. 21, 2011

(65) Prior Publication Data

US 2011/0278993 A1 Nov. 17, 2011

(30) Foreign Application Priority Data

May 17, 2010 (JP) ................................ 2010-112747
Jan. 25, 2011 (JP) ................................ 2011-012768

(51) Int. Cl.

| H01L 41/047 | (2006.01) |
|---|---|
| H03H 9/17 | (2006.01) |
| H03H 9/02 | (2006.01) |
| H01L 41/312 | (2013.01) |
| H03H 3/08 | (2006.01) |
| H01L 41/332 | (2013.01) |
| H03H 3/02 | (2006.01) |

(52) U.S. Cl.
CPC ............ H01L 41/312 (2013.01); H01L 41/332 (2013.01); H03H 2003/023 (2013.01); H03H 3/02 (2013.01); H03H 9/174 (2013.01); H03H 9/02015 (2013.01); H03H 3/08 (2013.01); H03H 2003/021 (2013.01); H03H 9/173 (2013.01)
USPC .................... 310/313 R; 310/313 B; 310/345

(58) Field of Classification Search
CPC ..... H03H 9/059; H03H 3/08; H03H 9/02574; H03H 9/02559; H03H 9/14505
USPC ...... 310/313 R, 313 A, 313 B, 313 C, 313 D, 310/345
See application file for complete search history.

(56) References Cited

U.S. PATENT DOCUMENTS 5,796,205 A * 8/1998 Nishihara et al. ......... 310/313 R
6,131,257 A * 10/2000 Nishihara et al. ............ 29/25.35

(Continued)

FOREIGN PATENT DOCUMENTS

JP 2002-534886 A 10/2002
JP 2010-109950 A 5/2010

(Continued)

OTHER PUBLICATIONS

Official Communication issued in corresponding European Patent Application No. 11165453.9, mailed on Jan. 30, 2014.

*Primary Examiner* — Derek Rosenau
*Assistant Examiner* — Bryan Gordon
(74) *Attorney, Agent, or Firm* — Keating & Bennett, LLP

(57) ABSTRACT

A piezoelectric device is manufactured in which the material of a supporting substrate can be selected from various alternative materials. Ions are implanted into a piezoelectric substrate to form an ion-implanted portion. A temporary supporting substrate is formed on the ion-implanted surface of the piezoelectric substrate. The temporary supporting substrate includes a layer to be etched and a temporary substrate. The piezoelectric substrate is then heated to be divided at the ion-implanted portion to form a piezoelectric thin film. A supporting substrate is then formed on the piezoelectric thin film. The supporting substrate includes a dielectric film and a base substrate. The temporary supporting substrate is made of a material that produces a thermal stress at the interface between the temporary supporting substrate and the piezoelectric thin film less than the thermal stress at the interface between the supporting substrate and the piezoelectric thin film.

3 Claims, 11 Drawing Sheets

(56) References Cited

U.S. PATENT DOCUMENTS

| | | |
|---|---|---|
| 6,445,265 B1 * | 9/2002 | Wright .......................... 333/193 |
| 6,767,749 B2 * | 7/2004 | Kub et al. ......................... 438/3 |
| 2008/0165565 A1 * | 7/2008 | Gunter et al. ................. 365/145 |
| 2009/0156016 A1 | 6/2009 | Di Cioccio |
| 2010/0088868 A1 | 4/2010 | Kando et al. |
| 2010/0107388 A1 * | 5/2010 | Iwamoto ..................... 29/25.35 |
| 2010/0112233 A1 | 5/2010 | Iwamoto et al. |

FOREIGN PATENT DOCUMENTS

| | | |
|---|---|---|
| KR | 10-2010-0024952 A | 3/2010 |
| WO | 2008/116879 A1 | 10/2008 |

\* cited by examiner

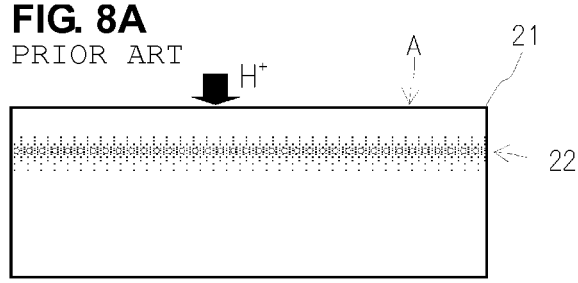
FIG. 8A
PRIOR ART
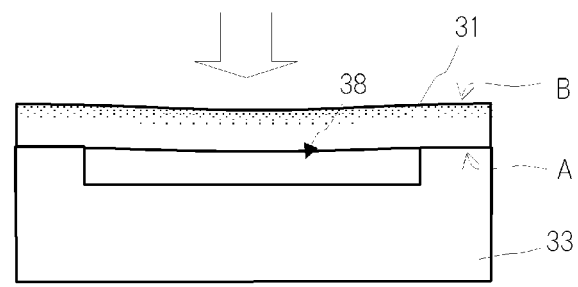
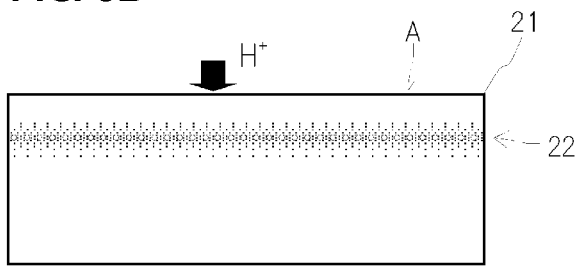
FIG. 8B
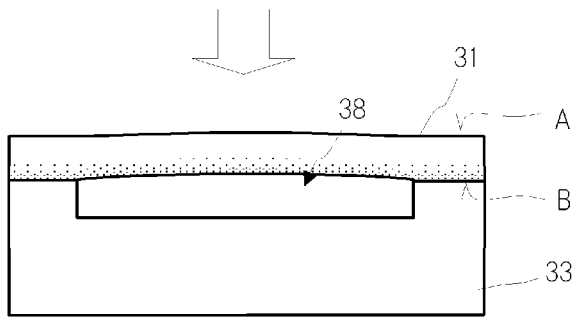

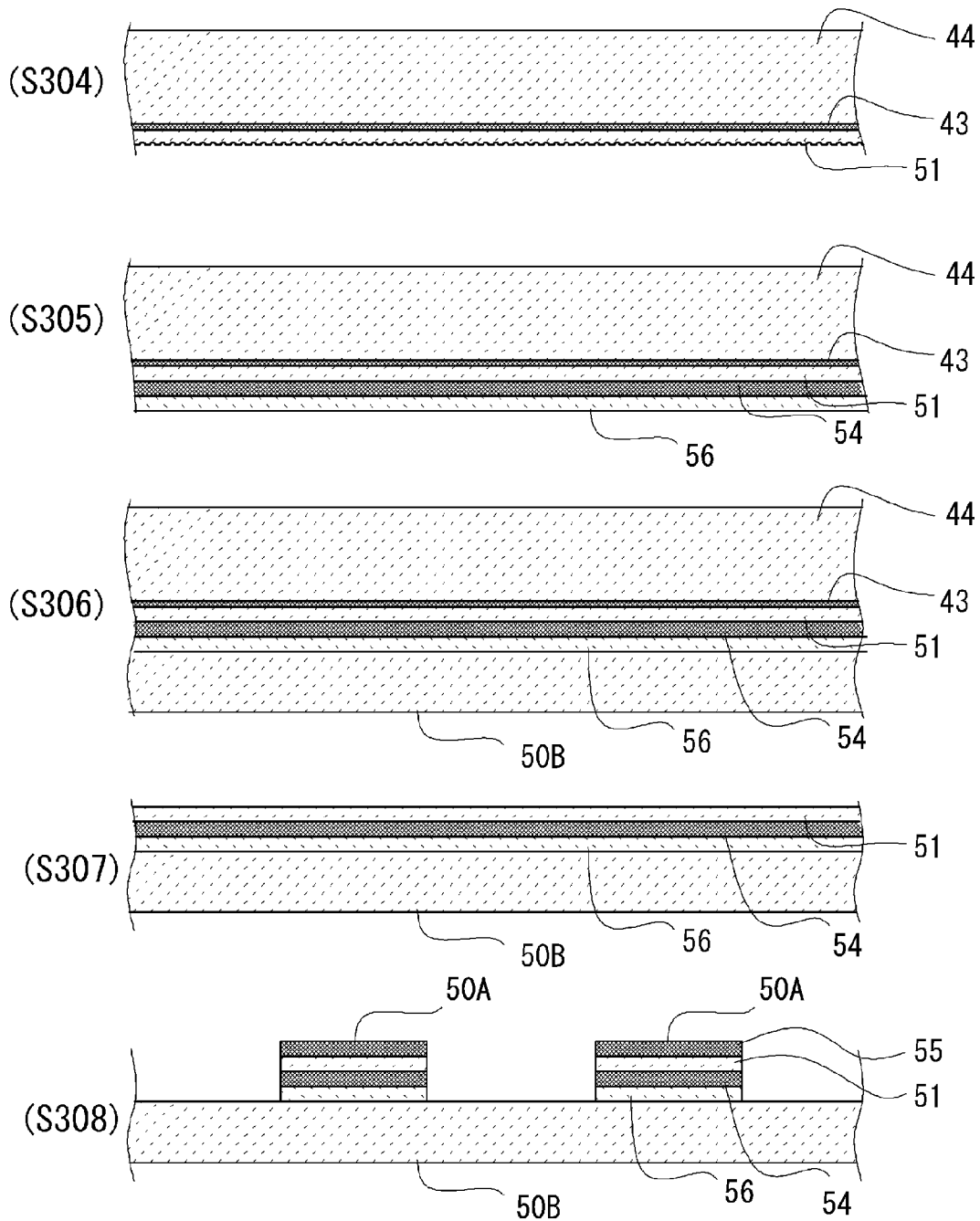

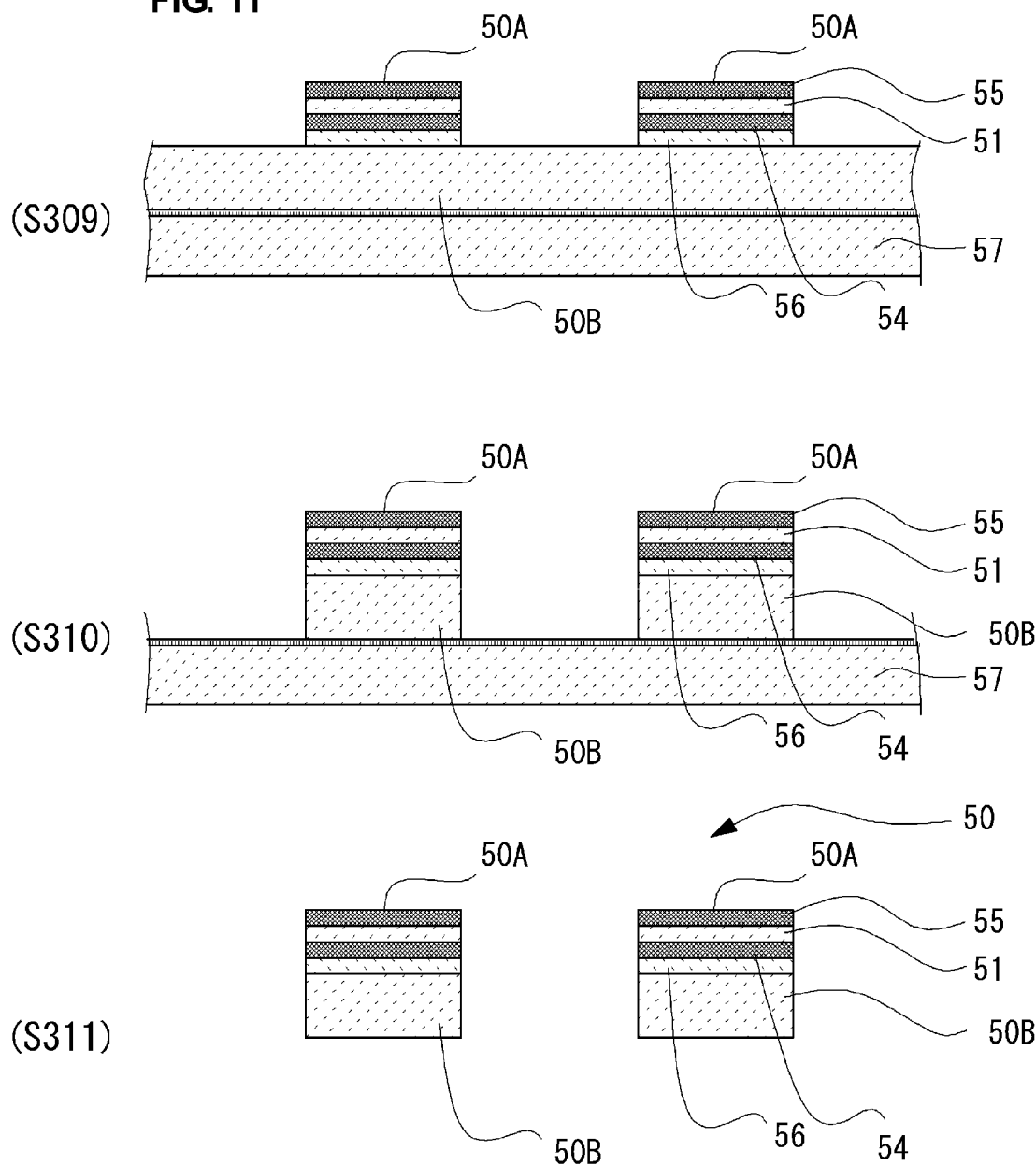

METHOD FOR MANUFACTURING COMPOSITE PIEZOELECTRIC SUBSTRATE AND PIEZOELECTRIC DEVICE

BACKGROUND OF THE INVENTION

1. Field of the Invention

The present invention relates to a method for manufacturing a composite piezoelectric substrate including a piezoelectric thin film and a piezoelectric device including the composite piezoelectric substrate. More particularly, the present invention relates to a method for manufacturing a composite piezoelectric substrate in which a piezoelectric thin film is subjected to heat treatment and a piezoelectric device including the composite piezoelectric substrate.

2. Description of the Related Art

Various piezoelectric devices that utilize piezoelectric thin films are being developed.

Piezoelectric devices include a composite piezoelectric substrate including a piezoelectric thin film and a supporting substrate (see, for example, Japanese Unexamined Patent Application Publication No. 2002-534886).

In accordance with Japanese Unexamined Patent Application Publication No. 2002-534886, the supporting substrate may be made of sapphire, silicon, or gallium arsenide, and the piezoelectric thin film may be made of a piezoelectric substance, such as quartz, lithium tantalate (LT), or lithium niobate (LN). Japanese Unexamined Patent Application Publication No. 2002-534886 also discloses a method for manufacturing a composite piezoelectric substrate in which a piezoelectric thin film is formed by dividing a piezoelectric substrate after ion implantation.

In this method, the piezoelectric substrate has a thickness sufficient for bonding, and ions, such as hydrogen ions, are implanted into one main surface of the piezoelectric substrate to form an ion-implanted layer. This main surface is then bonded to a supporting substrate by activated bonding or affinity bonding. The piezoelectric substrate is then heated to be divided at the ion-implanted layer to form the piezoelectric thin film.

Such a method can produce a composite piezoelectric substrate including a very thin piezoelectric film supported by a supporting substrate. However, implanted ions remaining in the piezoelectric thin film adversely affect the piezoelectricity of the composite piezoelectric substrate. Thus, in order to recover the piezoelectricity of the composite piezoelectric substrate, the piezoelectric thin film is sometimes heated at a temperature greater than the dividing temperature for a long period of time to remove the residual ions from the piezoelectric thin film.

Thus, in the method for manufacturing a composite piezoelectric substrate in which a piezoelectric thin film is formed by dividing a piezoelectric substrate at an ion-implanted layer, the piezoelectric thin film bonded to a supporting substrate is heated to a dividing temperature and an annealing temperature as described above. During these heating processes, a high thermal stress at the interface between the supporting substrate and the piezoelectric thin film can cause problems, such as the detachment or cracking of the piezoelectric thin film. Such defects in the piezoelectric thin film are particularly noticeable during the manufacture of large composite piezoelectric substrates, making it difficult to commercially manufacture large composite piezoelectric substrates. To avoid this, a supporting substrate must be made of a material that produces a low thermal stress during heat treatment. This imposes a significant constraint on the coefficient of linear expansion of the material.

Since the functions of piezoelectric devices depend on the characteristics of a supporting substrate, it is desirable to have various alternative suitable materials for the supporting substrate. In the case of devices for filter applications, a reduction in the coefficient of linear expansion of a supporting substrate can improve the temperature-frequency characteristics of a filter. However, due to the constraint on the coefficient of linear expansion, the material of a supporting substrate cannot have a coefficient of linear expansion much less than the coefficient of linear expansion of a piezoelectric thin film. It is desirable that the material of a supporting substrate have high thermal conductivity to improve the heat radiation characteristics and the electric power resistance of the supporting substrate. It is also desirable that the material of a supporting substrate be inexpensive in order to reduce the manufacturing costs of devices. However, such a material does not always satisfy the constraint on the coefficient of linear expansion. Furthermore, use of a material having high processibility, such as silicon, for a supporting substrate enables the supporting substrate to have a complicated structure. This permits a method for forming a piezoelectric thin film by dividing a piezoelectric substrate at an ion-implanted layer to be applied to various devices, such as micro-electro-mechanical systems (MEMS) and gyros. However, such a high-processibility material rarely satisfies the constraint on the coefficient of linear expansion. Thus, the material of a supporting substrate is significantly limited.

In accordance with Japanese Unexamined Patent Application Publication No. 2002-534886, electrodes are formed on the divided surface of the ion-implanted layer to produce a surface acoustic wave device. In this case, even after the piezoelectricity recovery treatment, ions remaining in the vicinity of the divided surface can cause significant piezoelectric degradation.

SUMMARY OF THE INVENTION

To overcome the problems described above, preferred embodiments of the present invention provide a method for manufacturing a piezoelectric device in which various alternative materials can be used for a supporting substrate, and a piezoelectric device having improved characteristics.

In accordance with a preferred embodiment of the present invention, a method for manufacturing a composite piezoelectric substrate that includes a piezoelectric thin film supported by a supporting substrate preferably includes an ion implantation step of implanting an ionized element into a piezoelectric substrate to form a portion having a peak concentration of the ionized element, a temporary supporting step of forming a temporary supporting substrate on a side of the ion-implanted surface of the piezoelectric substrate, the temporary supporting substrate being made of the same material as the piezoelectric substrate or producing a thermal stress at the interface between the temporary supporting substrate and the piezoelectric substrate that is less than the thermal stress at the interface between the supporting substrate and the piezoelectric substrate, a heating step of heating the piezoelectric substrate to divide the piezoelectric thin film from the piezoelectric substrate at the portion having a peak concentration of the ionized element to form the piezoelectric thin film, and a supporting step of forming the supporting substrate on the piezoelectric thin film.

In accordance with this manufacturing method, the composite piezoelectric substrate including the piezoelectric thin film supported by the supporting substrate can be manufactured such that the piezoelectric thin film is formed by dividing the piezoelectric substrate at the portion having a peak concentration of the implanted ionized element. The temporary supporting substrate preferably produces a negligible thermal stress at the interface between the temporary supporting substrate and the piezoelectric thin film. Alternatively, the temporary supporting substrate may preferably produce a thermal stress at the interface between the temporary supporting substrate and the piezoelectric thin film that is less than the thermal stress at the interface between the supporting substrate and the piezoelectric thin film. Since the heating step is performed while the temporary supporting substrate is disposed on a side of the ion-implanted surface of the piezoelectric substrate, the heating step produces a reduced thermal stress at the interface between the piezoelectric thin film and the temporary supporting substrate. The thermal stress at an interface depends on the difference in the linear expansions on both sides of the interface on the assumption that no restriction exists on the interface. Since the supporting substrate is formed on the piezoelectric thin film after the division at the portion having a peak concentration of the ionized element implanted in the piezoelectric substrate and after a heating process for recovering piezoelectricity, the supporting substrate may be made of a material having any coefficient of linear expansion.

In the supporting step, the supporting substrate is preferably formed on a side of the divided surface of the piezoelectric thin film. In accordance with a preferred embodiment of the present invention, the supporting step is preferably followed by a temporary supporting substrate removing step of removing the temporary supporting substrate disposed on the side of the ion-implanted surface of the piezoelectric thin film and an electrode forming step of forming a functional electrode of a piezoelectric device on the side of the ion-implanted surface.

In this manufacturing method, the front and back sides of the piezoelectric thin film are on opposite sides to the front and back sides of piezoelectric thin films manufactured by conventional methods. More specifically, preferably, the divided surface of the piezoelectric thin film faces the supporting substrate, and the ion-implanted surface of the piezoelectric thin film is spaced away from the supporting substrate. In the piezoelectric thin film formed by dividing the piezoelectric substrate at the portion having a peak concentration of the implanted ionized element, local piezoelectric degradation tends to decrease with decreasing the density of residual implanted ions. Thus, piezoelectric degradation is less in the vicinity of the ion-implanted surface than in the vicinity of the divided surface of the portion having a peak concentration of the implanted ionized element. Thus, a piezoelectric device having improved characteristics can be manufactured by forming a functional electrode on the side of the ion-implanted surface that suffers less piezoelectric degradation.

In accordance with a preferred embodiment of the present invention, the temporary supporting substrate preferably includes a layer to be etched, and the temporary supporting substrate removing step preferably includes removing the temporary supporting substrate by etching the layer to be etched.

Thus, the temporary supporting substrate can be removed by etching without unnecessary stress or impact on the piezoelectric thin film. This can further reduce defects in the piezoelectric thin film. Thus, a piezoelectric device having consistent characteristics can be manufactured. Furthermore, this permits the reuse of a temporary supporting substrate main body after the layer to be etched has been removed, thus providing a cost advantage.

In accordance with a preferred embodiment of the present invention, the heating step preferably includes, after the piezoelectric thin film is divided from the piezoelectric substrate by heating at a first temperature, an annealing step of annealing the piezoelectric thin film at a second temperature greater than the first temperature.

The annealing of the piezoelectric thin film formed by dividing the piezoelectric substrate at the portion having a peak concentration of the implanted element can remove ions remaining between crystal lattices and reduce a crystal lattice distortion caused by ion implantation, thus recovering the crystallinity of the piezoelectric thin film. This recovers the piezoelectricity of the piezoelectric thin film. Thus, a piezoelectric device having improved characteristics can be manufactured.

In accordance with a preferred embodiment of the present invention, the supporting substrate preferably includes a dielectric film disposed on the piezoelectric thin film.

For example, in filters, a dielectric film may preferably be disposed on a piezoelectric thin film to control the propagation velocity of a wave or improve the reliability of the device. The material of such a dielectric film must have a dielectric constant suitable for each purpose. However, under the constraint on thermal stress, the selection of such a material has been significantly limited. In accordance with this preferred embodiment, the supporting substrate including the dielectric film is formed on the piezoelectric thin film after the heating step. Thus, a material having any coefficient of linear expansion can be used for the dielectric film without considering the thermal stress at the interface between the piezoelectric thin film and the dielectric film.

In accordance with a preferred embodiment of the present invention, the electrode forming step preferably includes forming an interdigital transducer (IDT) electrode as the functional electrode of the piezoelectric device.

This enables the composite piezoelectric substrate to be used as a surface acoustic wave device or a boundary wave device, for example.

In accordance with a preferred embodiment of the present invention, preferably, the supporting substrate includes a membrane layer on the piezoelectric thin film, the membrane layer including a sacrificial layer region and a support layer region, and the method further includes, after the supporting step, a step of removing the sacrificial layer region to form a cavity.

In the piezoelectric thin film formed by dividing the piezoelectric substrate at the portion having a peak concentration of the implanted ionized element, the collision energy of ions to be implanted and the lattice interval tends to increase with decreasing distance from the ion-implanted surface. Thus, the piezoelectric thin film has a concave stress on the divided surface side and a convex stress on the ion-implanted surface side. In conventional piezoelectric thin films, the ion-implanted surface of the piezoelectric thin film faces a cavity of a membrane structure, and the piezoelectric thin film tends to bulge out on the cavity side, which causes sticking that tends to collapse the cavity. As described above, the front and back sides of the piezoelectric thin film according to preferred embodiments are on opposite sides to the front and back sides of conventional piezoelectric thin films. The piezoelectric thin film according to preferred embodiments therefore tends to bulge out away from the cavity of the membrane structure, thus rarely causing sticking. Thus, a piezoelectric device having consistent characteristics can be manufactured.

In accordance with a preferred embodiment of the present invention, a piezoelectric device preferably includes a piezoelectric thin film formed by dividing a piezoelectric substrate at a portion having a peak concentration of an ionized element implanted in the piezoelectric substrate, a supporting substrate disposed on a side of the divided surface of the piezoelectric thin film, and a functional electrode disposed on a side of the ion-implanted surface of the piezoelectric thin film.

In accordance with a preferred embodiment of the present invention, the functional electrode is preferably an interdigital transducer (IDT) electrode, for example.

In accordance with a preferred embodiment of the present invention, a support layer region and a cavity are preferably disposed between the supporting substrate and the piezoelectric thin film, the support layer region enabling the piezoelectric thin film to be supported by the supporting substrate, the cavity being formed by removal of a sacrificial layer region.

In accordance with various preferred embodiments of the present invention, the temporary supporting substrate produces a negligible thermal stress at the interface between the temporary supporting substrate and the piezoelectric substrate. Alternatively, the temporary supporting substrate produces a thermal stress at the interface between the temporary supporting substrate and the piezoelectric substrate less than the thermal stress at the interface between the supporting substrate and the piezoelectric substrate. Since the heating step is performed while the temporary supporting substrate is disposed on a side of the ion-implanted surface of the piezoelectric substrate, the piezoelectric thin film includes fewer defects during heating than conventional piezoelectric thin films. In particular, the composite piezoelectric substrate can be manufactured with much fewer defects using a piezoelectric single crystal material. The supporting substrate is formed on the piezoelectric thin film after the heating step. Thus, material having any coefficient of linear expansion can be used for the supporting substrate without considering the thermal stress at the interface between the piezoelectric thin film and the supporting substrate in the heating step.

This enables various combinations of the material of the piezoelectric thin film and the material of the supporting substrate to be used. In the case of devices for filter applications, use of a supporting substrate made of a material having a much smaller coefficient of linear expansion than a piezoelectric thin film improves the temperature-frequency characteristics of a filter. Use of a material having high thermal conductivity for the supporting substrate improves the heat radiation characteristics and the electric power resistance of the supporting substrate. Use of an inexpensive material for the supporting substrate reduces the manufacturing costs of the device. Furthermore, use of a material having high processibility, such as silicon, for example, for a supporting substrate enables the supporting substrate to have a complicated structure. This permits a method for forming a piezoelectric thin film by dividing a piezoelectric substrate at a portion having a peak concentration of the implanted element to be applied to various devices, such as micro-electro-mechanical systems (MEMS) and gyros, for example.

Piezoelectric degradation is less in the vicinity of the ion-implanted surface of the piezoelectric thin film than in the vicinity of the divided surface. Thus, a piezoelectric device having improved characteristics can be manufactured by forming a functional electrode on a side of the ion-implanted surface.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A is a schematic view of a bulk wave device manufactured by a conventional method.

FIG. 8B is a schematic view of a bulk wave device according to a preferred embodiment of the present invention.

FIG. 10 is a schematic view of a process for manufacturing a piezoelectric device in accordance with the production flow illustrated in FIG. 9.

FIG. 11 is a schematic view of a process for manufacturing a piezoelectric device in accordance with the production flow illustrated in FIG. 9.

DETAILED DESCRIPTION OF THE PREFERRED EMBODIMENTS

First Preferred Embodiment

Figure 1:
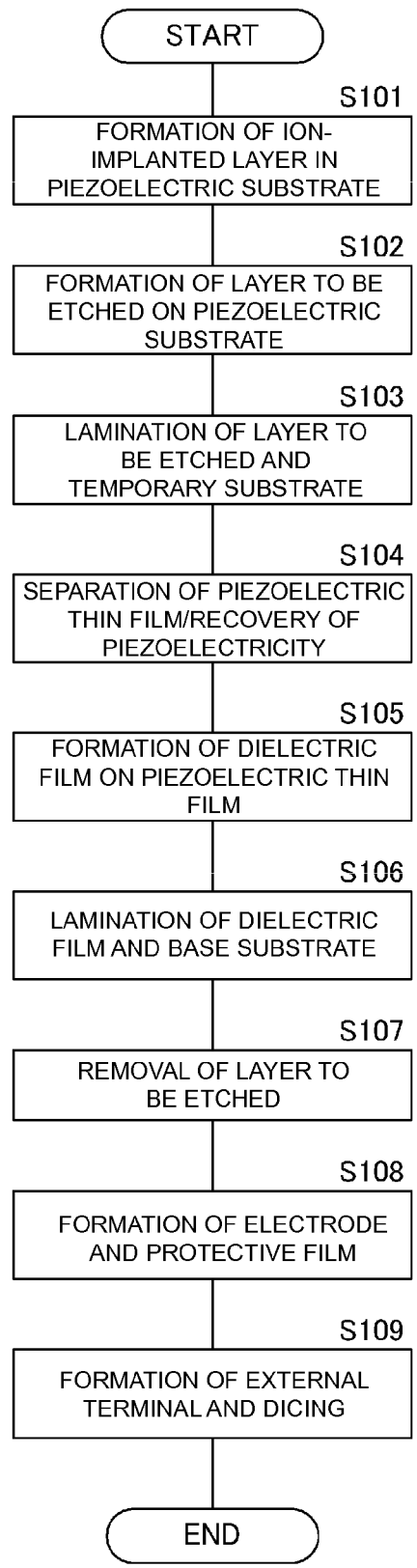
FIG. 1 is a flow chart of a method for manufacturing a piezoelectric device according to a first preferred embodiment of the present invention.
Figure 2:
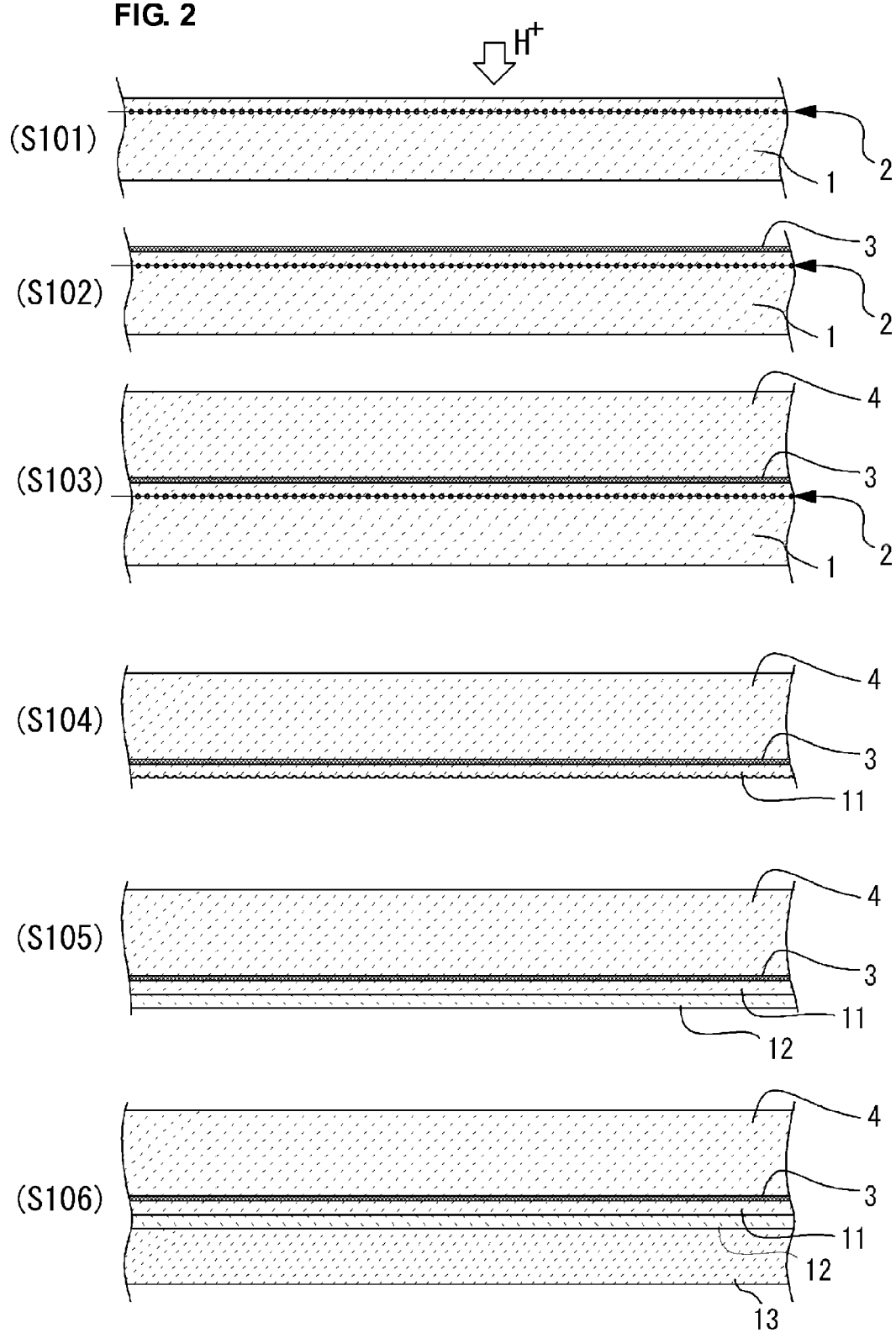
FIG. 2 is a schematic view of a process for manufacturing a piezoelectric device in accordance with the production flow illustrated in FIG. 1.
Figure 3:
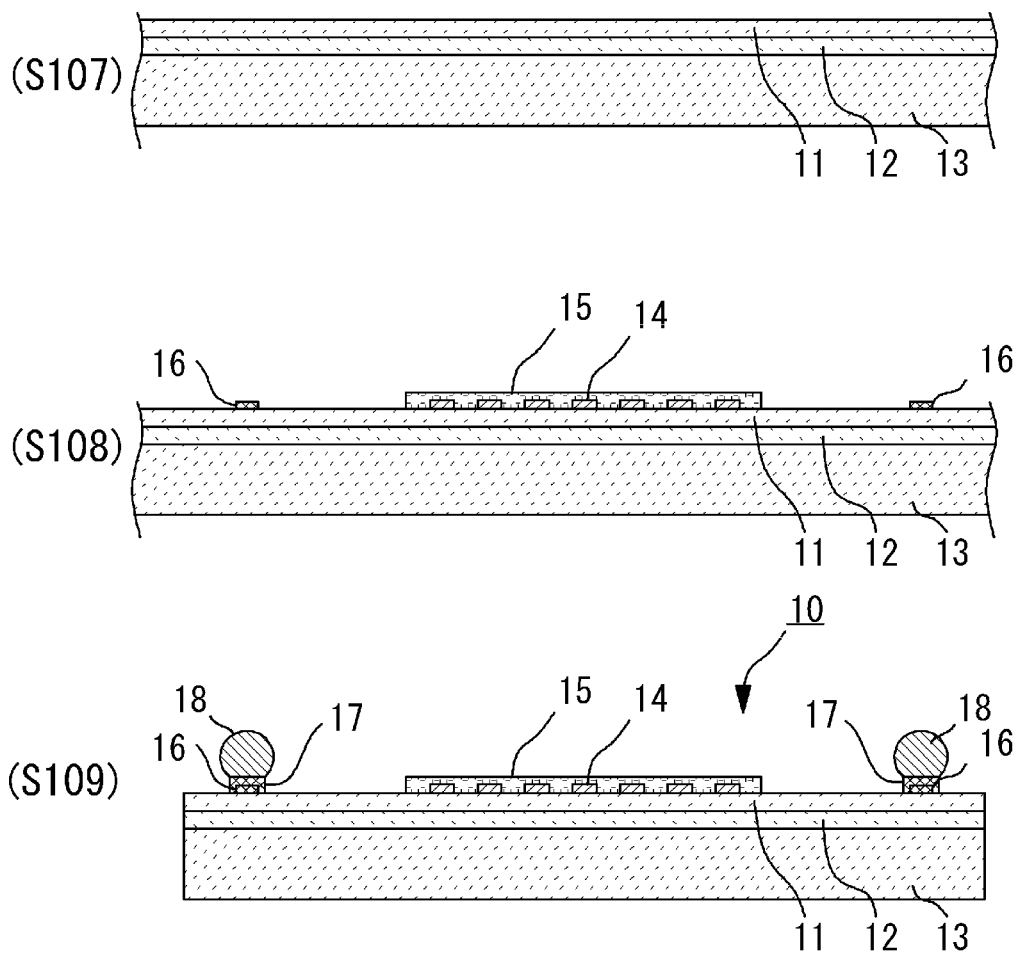
FIG. 3 is a schematic view of a process for manufacturing a piezoelectric device in accordance with the production flow illustrated in FIG. 1.

A method for manufacturing a surface acoustic wave device including a composite piezoelectric substrate according to a first preferred embodiment of the present invention will be described below with reference to FIGS. 1 to 4B. FIG. 1 is a flow chart of a method for manufacturing a surface acoustic wave device according to the first preferred embodiment. FIGS. 2 and 3 are schematic cross-sectional views of manufacturing steps described in the flow chart in FIG. 1.

First, an ion implantation step is performed on a piezoelectric substrate 1 (FIGS. 1 and 2: S101). The piezoelectric substrate 1 is preferably a single-crystal substrate made of a piezoelectric substance, for example. In the ion implantation step, ions are implanted into a flat main surface of the piezoelectric substrate 1 to form an ion-implanted portion 2 in the main surface.

The piezoelectric substrate 1 is preferably a $LiTaO_3$ (LT) single-crystal substrate, for example. The piezoelectric substrate 1 can be divided by the ion-implanted portion 2 by the application of heat as described below. The piezoelectric substrate 1 may be made of any piezoelectric material, such as LT, $LiNbO_3$ (LN), $Li_2B_4O_7$ (LBO), langasite ($La_3Ga_5SiO_{14}$), $KNbO_3$ (KN), or $K_3Li_2Nb_5O_{15}$ (KLN), for example.

In the first preferred embodiment, hydrogen ions are preferably implanted into the piezoelectric substrate 1 at an acceleration energy of approximately 150 KeV and a dose of approximately $1.0 \times 10^{17}$ atom/cm², for example. The hydrogen ions in the piezoelectric substrate 1 are primarily distributed at a depth of approximately 1 μm, for example from the ion-implanted surface, forming the ion-implanted portion 2. Therefore, the ion-implanted portion 2 has the peak hydrogen ion concentration. The type of ions to be implanted depends on the material of the piezoelectric substrate 1 and may be helium ions or argon ions, for example. The ion implantation conditions depend on the material of the piezoelectric substrate 1 and the thickness of a piezoelectric thin film. For example, an acceleration energy of approximately 75 KeV results in the ion-implanted portion 2 at a depth of approximately 0.5 μm.

An etching layer forming step is then performed in which a layer to be etched 3 is formed on the ion-implanted surface of the piezoelectric substrate 1 (FIGS. 1 and 2: S102). The layer to be etched 3 may preferably be made of a material that can be selectively etched in a subsequent temporary supporting substrate removing step while the piezoelectric thin film and a supporting substrate are not etched. The layer to be etched 3 may preferably be made of an inorganic material, such as ZnO, $SiO_2$, or AlN, a metallic material, such as Cu, Al, or Ti, an organic material, such as polyimide, or a combination thereof, for example. The layer to be etched may be omitted.

A temporary supporting step is then performed in which the layer to be etched 3 on the piezoelectric substrate 1 is bonded to a temporary substrate 4 (FIGS. 1 and 2: S103). The temporary substrate 4 and the layer to be etched 3 define a temporary supporting substrate. The material of the temporary supporting substrate produces a thermal stress at the interface between the temporary supporting substrate and the piezoelectric substrate 1 that is less than the thermal stress at the interface between a supporting substrate described below and the piezoelectric substrate 1. Preferably, the material of the temporary supporting substrate produces a negligible thermal stress.

In the first preferred embodiment, the temporary substrate 4 is preferably an LT substrate, for example, which is the same as the piezoelectric substrate 1, and the layer to be etched 3 is preferably composed of a Cu film and a $SiO_2$ film layered by sputtering, for example. Thus, the temporary substrate 4 preferably has the same or substantially the same coefficient of linear expansion as the piezoelectric substrate 1. This results in a negligible thermal stress at the interface between the piezoelectric thin film 11 and the temporary supporting substrate, which is composed of the layer to be etched 3 and the temporary substrate 4. The layer to be etched 3 has a coefficient of linear expansion different from the coefficient of linear expansion of the LT substrate. However, the formation of a film made of a ductile material, such as a metallic material, for example, a Cu film, directly on the piezoelectric substrate 1 and a sufficient reduction in the thickness of the layer to be etched 3 (approximately one-tenth or less of the thickness of the piezoelectric substrate or the temporary substrate) can reduce the thermal stress at the interface between the layer to be etched 3 and the piezoelectric thin film 11.

A heating step is then performed in which the piezoelectric substrate 1, the layer to be etched 3, and the temporary substrate 4 are heated (FIGS. 1 and 2: S104). The heating enables the piezoelectric substrate 1 to be divided by the ion-implanted portion 2 to form the piezoelectric thin film 11, thereby forming a composite piezoelectric substrate including the temporary substrate 4, the layer to be etched 3, and the piezoelectric thin film 11. The composite piezoelectric substrate is then annealed to recover its piezoelectricity at a temperature greater than the dividing temperature, for example, approximately 400° C., at which the piezoelectric substrate 1 has been divided to form the piezoelectric thin film 11. For example, the annealing conditions may preferably be approximately 500° C. for approximately three hours. Thus, the heating step including annealing can divide the piezoelectric substrate 1 by the ion-implanted portion 2 to form the piezoelectric thin film 11, remove hydrogen ions remaining between crystal lattices, reduce a crystal lattice distortion caused by ion implantation to recover the crystallinity of the piezoelectric thin film, and thereby recover the piezoelectricity of the piezoelectric thin film.

A planarization and dielectric film forming step is performed in which the surface of the piezoelectric thin film 11 is planarized, and a dielectric film 12 is formed on the piezoelectric thin film 11 (FIGS. 1 and 2: S105). This step may be performed by any method at a temperature substantially equal to or less than the annealing temperature, preferably substantially equal to or less than the dividing temperature. The dielectric film 12 is not essential and may be omitted.

The divided surface of the piezoelectric thin film 11 is preferably polished, for example, by chemical-mechanical polishing (CMP) to a surface roughness Ra of approximately 1 nm or less. The dielectric film 12 may preferably be made of silicon oxide, silicon nitride, silicon oxynitride, a metal oxide, a metal nitride, or diamond-like carbon, for example. This enables the propagation velocity of a surface acoustic wave in a surface acoustic wave device to be controlled in a manner that depends on the dielectric constant of the dielectric film 12, thus easily achieving desired device characteristics. Preferably, the dielectric film 12 is made of a material having a large thermal conductivity and a small coefficient of linear expansion, as well as an appropriate dielectric constant. The dielectric film 12 may preferably have a multilayer structure, such as a two-layer structure including a layer having a small coefficient of linear expansion and a layer having a large thermal conductivity. A large thermal conductivity improves the heat radiation characteristics and the electric power resistance of the surface acoustic wave device. A small coefficient of linear expansion improves the temperature-frequency characteristics of the surface acoustic wave device.

A supporting step is then performed in which the dielectric film 12 on the piezoelectric thin film 11 is bonded to a base substrate 13 (FIGS. 1 and 2: S106). This step may be performed by any method at a temperature substantially equal to or less than the annealing temperature, preferably substantially equal to or less than the dividing temperature.

The base substrate 13 and the dielectric film 12 define a supporting substrate. Unlike the temporary supporting substrate, the supporting substrate may be made of a material having any coefficient of linear expansion without considering the thermal stress at the interface between the supporting substrate and the piezoelectric substrate (piezoelectric thin film) in the heating step. Thus, the dielectric film 12 and the base substrate 13 may be made of a material having a much smaller coefficient of linear expansion than the piezoelectric thin film 11. This significantly improves the temperature-frequency characteristics of the surface acoustic wave device. Use of a heat-conductive material for the dielectric film 12 and the base substrate 13 improves the heat radiation characteristics and the electric power resistance of the surface acoustic wave device. Use of an inexpensive material for the dielectric film 12 and the base substrate 13 and an inexpensive method for forming the dielectric film 12 and the base substrate 13 reduces the manufacturing costs of the surface acoustic wave device.

A temporary supporting substrate removing step is then performed in which the temporary supporting substrate including the layer to be etched 3 and the temporary substrate 4 is removed (FIGS. 1 and 3: S107). This step may be performed by any method at a temperature substantially equal to or less than the annealing temperature, preferably substantially equal to or less than the dividing temperature.

In order to remove the temporary supporting substrate including the layer to be etched 3 and the temporary substrate 4, the layer to be etched 3 is preferably wet-etched or dry-etched. In general, the layer to be etched 3 that is made of an inorganic material or a metallic material is wet-etched, and the layer to be etched 3 that is made of an organic material is dry-etched. Etching removes the layer to be etched 3 and the temporary substrate 4 without unnecessary stress or impact on the piezoelectric thin film 11, thereby reducing defects in the piezoelectric thin film 11. The temporary substrate 4 separated from the layer to be etched 3 is preferably reused to manufacture another surface acoustic wave device.

An electrode and protective film forming step is then performed in which IDT electrodes 14, a lead wire 16, and a $SiO_2$ film defining an IDT electrode protective film 15 are preferably formed on the piezoelectric thin film 11 (FIGS. 1 and 3: S108). The IDT electrodes 14 preferably include two interdigitated electrodes, for example, and may preferably be made of Al, W, Mo, Ta, Hf, Cu, Pt, Ti, and/or Au alone or in combination, for example. The IDT electrodes 14 may preferably be made of an alloy thereof, for example. The lead wire 16 may preferably be made of Al or Cu, for example. This step may be performed by any method at a temperature substantially equal to or less than the annealing temperature, preferably substantially equal to or less than the dividing temperature.

An external terminal forming and dicing step is then performed in which bumps 17 and solder balls 18 are formed, and a composite piezoelectric substrate including the piezoelectric thin film 11, the dielectric film 12, and the base substrate 13 is divided into a plurality of surface acoustic wave devices 10 (FIGS. 1 and 3: S109). This step may be performed by any method at a temperature substantially equal to or less than the annealing temperature, preferably substantially equal to or less than the dividing temperature.

Through these steps of manufacturing surface acoustic wave devices 10, a composite piezoelectric substrate is formed. The composite piezoelectric substrate preferably includes the piezoelectric thin film 11 on the supporting substrate including the dielectric film 12 and the base substrate 13. The piezoelectric thin film 11 is preferably formed by a method for forming a piezoelectric thin film by dividing a piezoelectric substrate at an ion-implanted portion. In the surface acoustic wave device 10 manufactured using a temporary supporting substrate that produces a reduced thermal stress in the heating step, the piezoelectric thin film 11 has fewer defects resulting from thermal stress than conventional piezoelectric thin films. Since the dielectric film 12 and the base substrate 13 are formed on the piezoelectric thin film 11 after the heating step, the materials of the dielectric film 12 and the base substrate 13 can be determined without considering thermal stress in the heating step.

A single-crystal piezoelectric thin film prepared by dividing a single-crystal substrate at an ion-implanted portion tends to be cleaved more easily than piezoelectric thin films formed by deposition. Thus, it has previously been essential to pay particular attention to stress resulting from a difference in the coefficient of linear expansion in the heat treatment for recovering piezoelectricity. However, in accordance with preferred embodiments of the present invention, a single-crystal piezoelectric thin film can be easily manufactured while reducing the stress resulting from a difference in the coefficient of linear expansion.

The supporting substrate including the dielectric film and the base substrate 13 is preferably disposed on the divided surface of the piezoelectric thin film 11 in the piezoelectric substrate 1. Thus, the divided surface and ion-implanted surface of the piezoelectric thin film 11 are on opposite sides to those manufactured by a conventional method. An example of the operational advantage of preferred embodiments of the present invention will be described below with reference to FIGS. 4A and 4B based on the structure of the surface acoustic wave device 10 in which the divided surface and ion-implanted surface of the piezoelectric thin film 11 are on opposite sides to those manufactured by a conventional method.

Figure 4A:
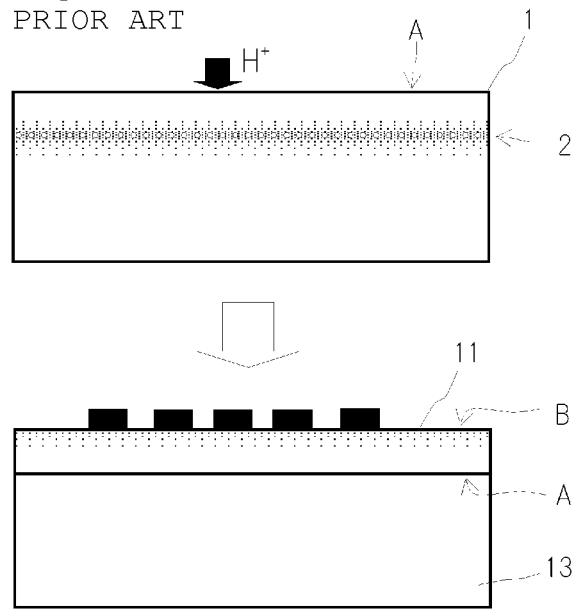
FIG. 4A is a schematic view of a surface acoustic wave device manufactured by a conventional method.
Figure 4B:
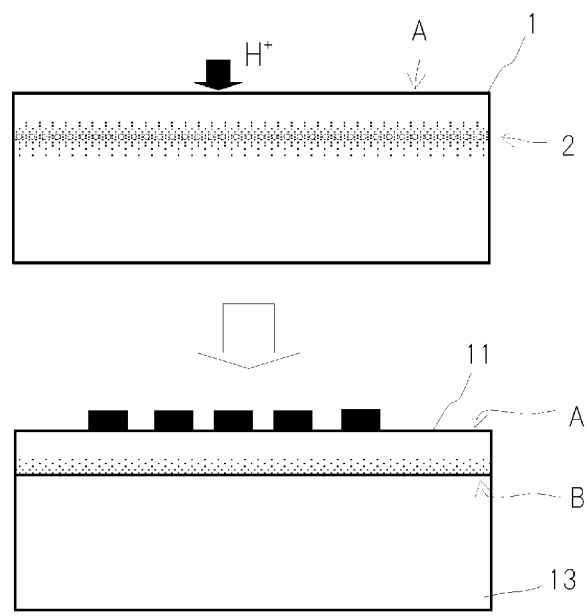
FIG. 4B is a schematic view of a surface acoustic wave device according to a preferred embodiment of the present invention.

FIG. 4A is a schematic view of a surface acoustic wave device manufactured by a conventional method. FIG. 4B is a schematic view of a surface acoustic wave device according to a preferred embodiment of the present invention. In both cases, ions are implanted through an ion-implanted surface A into a piezoelectric substrate 1 in an ion implantation step to form an ion-implanted portion 2. The piezoelectric substrate 1 is then divided at the ion-implanted portion 2 to form a piezoelectric thin film 11. In the conventional method, a supporting substrate is formed on the ion-implanted surface A, and a functional electrode of a device is formed on the divided surface B of the piezoelectric thin film 11. In the first preferred embodiment of the present invention, a temporary supporting substrate is formed on the ion-implanted surface A, a supporting substrate is formed on the divided surface B, and after the temporary supporting substrate is removed, a functional electrode of a device is formed on the ion-implanted surface A.

The piezoelectric thin film 11 formed by a method for forming a piezoelectric thin film by dividing a piezoelectric substrate at an ion-implanted portion includes some hydrogen ions even after the crystallinity and the piezoelectricity of the piezoelectric thin film have been recovered in the heating step. The density of residual hydrogen ions is relatively high in the ion-implanted portion 2 in the piezoelectric substrate 1, that is, in the vicinity of the divided surface B of the piezoelectric thin film 11, and relatively low in the vicinity of the ion-implanted surface A. Local piezoelectric degradation tends to decrease with decreasing density of residual hydrogen ions. Thus, piezoelectric degradation is relatively large in the vicinity of the divided surface B and relatively small in the vicinity of the ion-implanted surface A. A surface acoustic wave device according to the present preferred embodiment of the present invention preferably includes a functional electrode on the ion-implanted surface A which suffers less piezoelectric degradation. Thus, the surface acoustic wave device according to the present preferred embodiment has better characteristics than a surface acoustic wave device manufactured by a conventional method.

Although a method for manufacturing a surface acoustic wave device has been described in the first preferred embodiment, an elastic boundary wave device can be manufactured by the same process.

Second Preferred Embodiment

Figure 5:
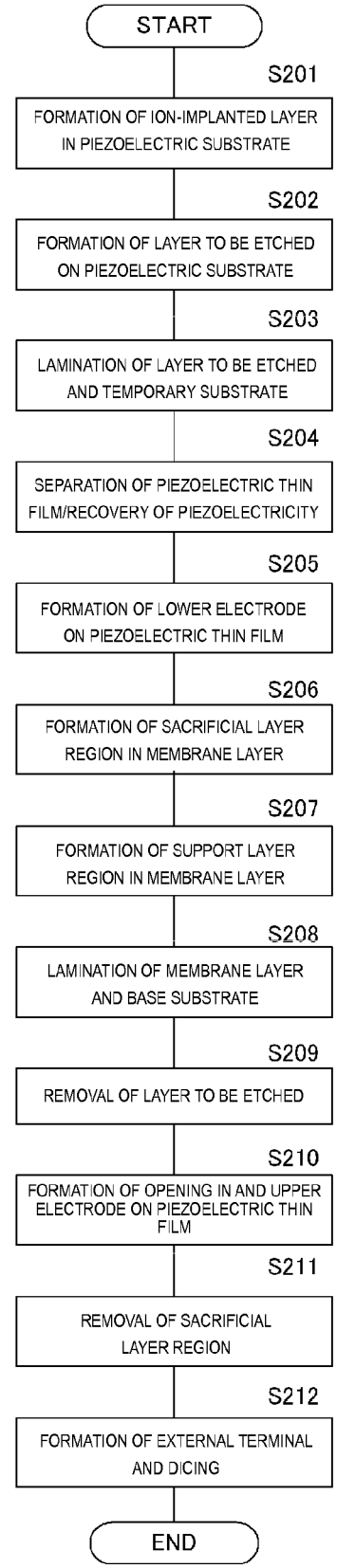
FIG. 5 is a flow chart of a method for manufacturing a piezoelectric device according to a second preferred embodiment of the present invention.
Figure 6:
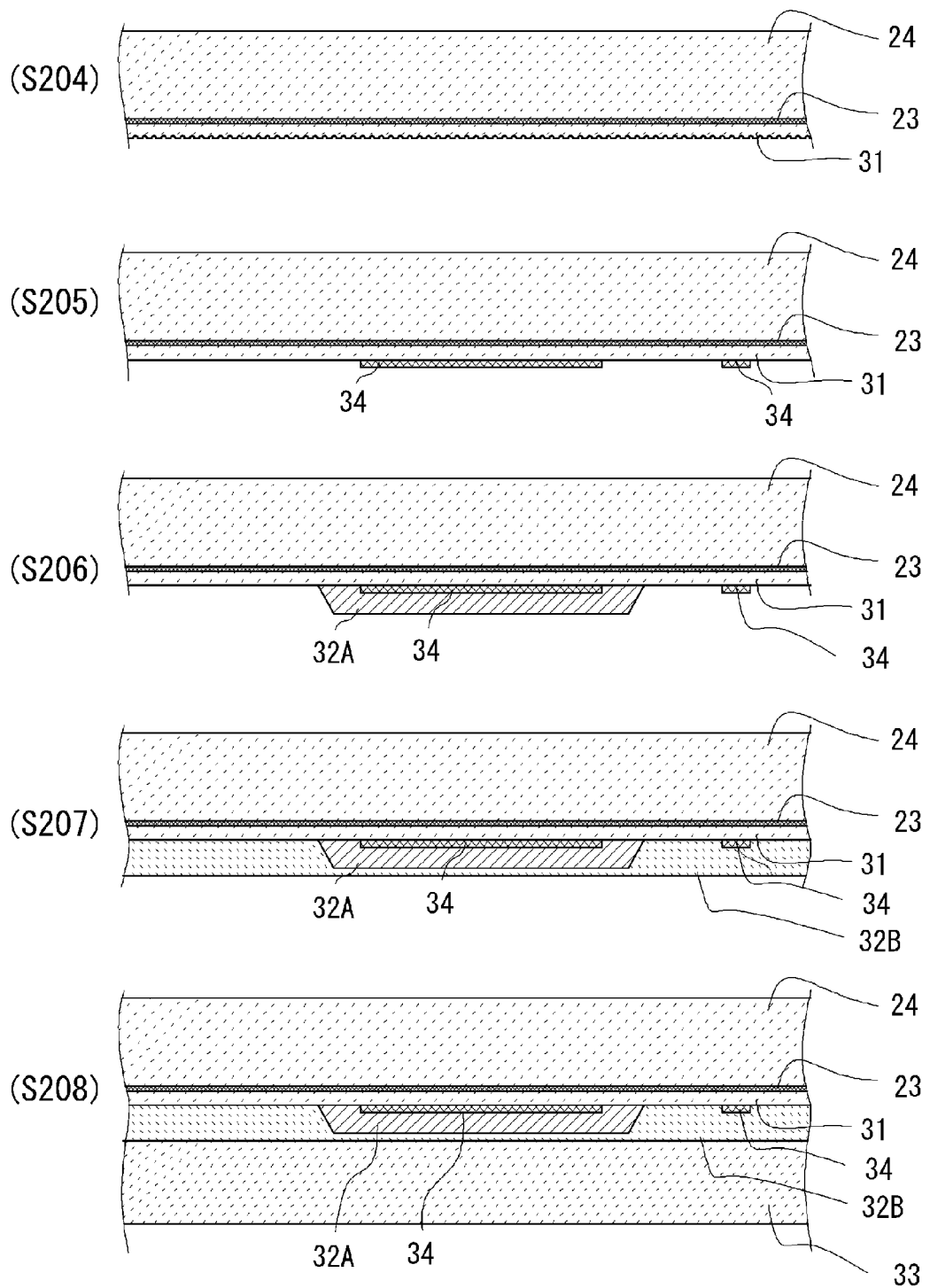
FIG. 6 is a schematic view of a process for manufacturing a piezoelectric device in accordance with the production flow illustrated in FIG. 5.
Figure 7:
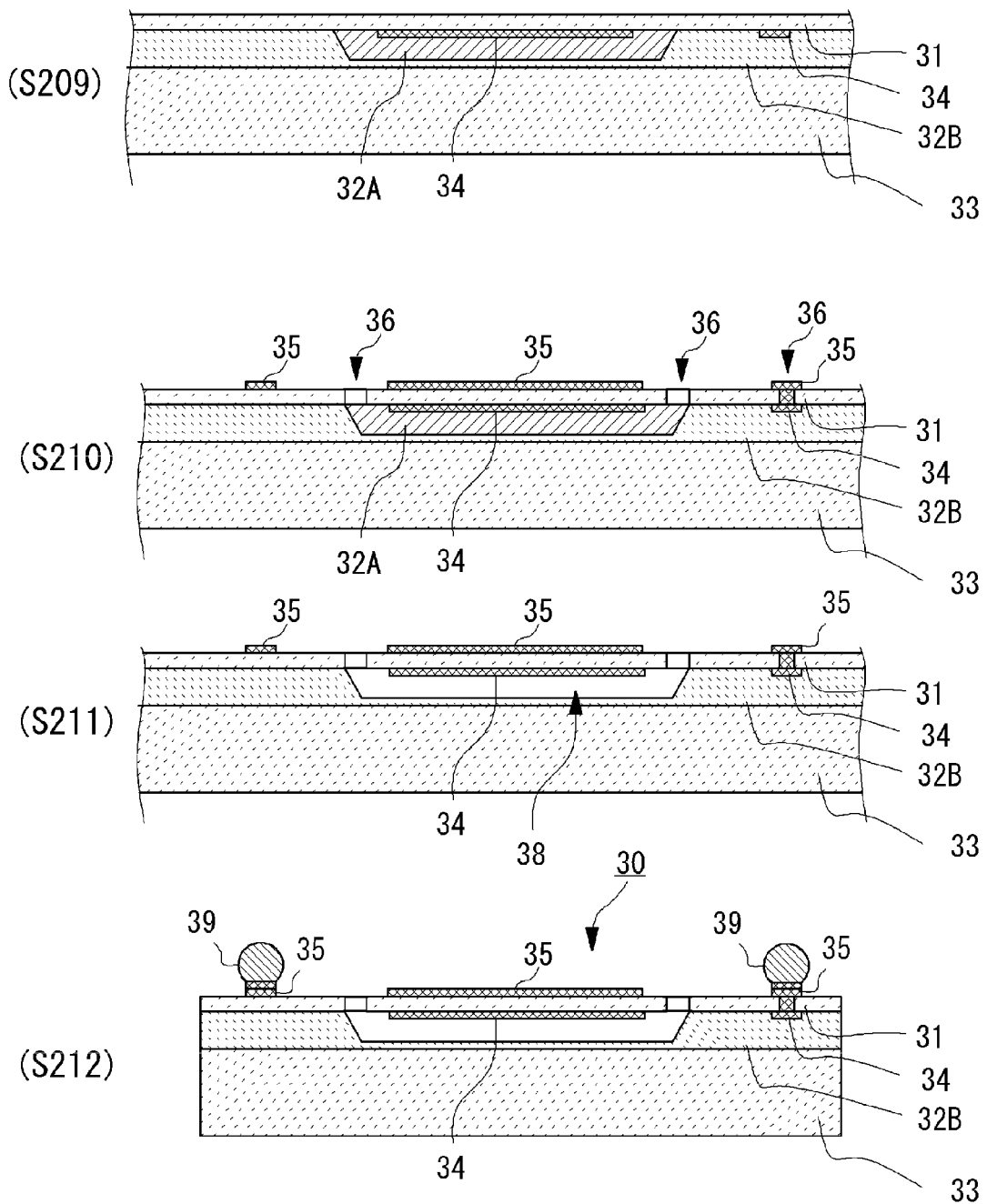
FIG. 7 is a schematic view of a process for manufacturing a piezoelectric device in accordance with the production flow illustrated in FIG. 5.

A method for manufacturing a bulk wave device including a composite piezoelectric substrate according to a second preferred embodiment of the present invention will be described below with reference to FIGS. 5 to 8B. FIG. 5 is a flow chart of a method for manufacturing a bulk wave device according to the second preferred embodiment. FIGS. 6 and 7 are schematic cross-sectional views of manufacturing steps described in the flow chart in FIG. 5.

In the same or substantially the same manner as in the first preferred embodiment, an ion implantation step is performed first (FIG. 5: S201). An etching layer forming step is then performed (FIG. 5: S202). A temporary supporting step is then performed (FIG. 5: S203). A heating step is then performed (FIGS. 5 and 6: S204). A temporary supporting substrate including a layer to be etched 23 and a temporary substrate 24 is formed on the ion-implanted surface of a piezoelectric thin film 31 preferably having a thickness of approximately 1 μm, for example. As in the first preferred embodiment, the layer to be etched may be omitted.

The divided surface of the piezoelectric thin film 31 is planarized, and lower electrodes 34, e.g., a lower drive electrode and a lower lead wire, arranged to drive a bulk wave device are formed (FIGS. 5 and 6: S205). This step may be performed by any method at a temperature substantially equal to or less than the annealing temperature, preferably substantially equal to or less than the dividing temperature.

The material of the lower drive electrode depends on the required physical properties of the bulk wave device and may preferably be a high-melting-point metallic material, such as W, Mo, Ta, or Hf, a low-resistance metal, such as Cu or Al, a metallic material resistant to thermal diffusion, such as Pt, or a metallic material having good adhesion to a piezoelectric material, such as Ti or Ni, for example. The lower drive electrode may preferably be a multilayer film including at least one of these metallic materials. The electrode may be formed by any method depending on the type of the electrode material and the desired physical properties, for example, electron-beam (EB) vapor deposition, sputtering, or chemical vapor deposition (CVD). The material of the lower lead wire may preferably be Cu or Al, for example.

A sacrificial layer region 32A having a membrane structure is then formed (FIGS. 5 and 6: S206). This step may be performed by any method at a temperature substantially equal to or less than the annealing temperature, preferably substantially equal to or less than the dividing temperature.

A support layer region 32B having a membrane structure is then formed (FIGS. 5 and 6: S207). This step may be performed by any method at a temperature substantially equal to or less than the annealing temperature, preferably substantially equal to or less than the dividing temperature. The surface of the support layer region 32B is preferably polished to planarize the surface.

The sacrificial layer region 32A and the support layer region 32B each preferably having a membrane structure define a membrane layer. The material of the sacrificial layer region 32A is preferably chosen such that an etching gas or an etching liquid in the subsequent removal of the sacrificial layer can etch the sacrificial layer region 32A but cannot etch the lower electrodes 34. The material of the sacrificial layer may preferably be a metal, such as Ni, Cu, or Al, an insulating material, such as SiO$_2$, ZnO, or phosphosilicate glass (PSG), or an organic material, for example.

The membrane layer including the sacrificial layer region 32A and the support layer region 32B is bonded to a base substrate 33 (FIGS. 5 and 6: S208). This step may be performed by any method at a temperature substantially equal to or less than the annealing temperature, preferably substantially equal to or less than the dividing temperature.

The base substrate 33 and the membrane layer define a supporting substrate. The supporting substrate including the base substrate 33, the sacrificial layer region 32A, and the support layer region 32B may be made of a material having any coefficient of linear expansion without considering the thermal stress at the interface between the supporting substrate and the piezoelectric thin film 31.

The layer to be etched 23 is then etched to remove the temporary supporting substrate including the layer to be etched 23 and the temporary substrate 24 (FIGS. 5 and 7: S209). This step may be performed by any method at a temperature substantially equal to or less than the annealing temperature, preferably substantially equal to or less than the dividing temperature.

Upper electrodes 35, including an upper drive electrode and an upper lead wire, to drive the bulk wave device are preferably formed on the ion-implanted surface of the piezoelectric thin film 31 (FIGS. 5 and 7: S210). This step may be performed by any method at a temperature substantially equal to or less than the annealing temperature, preferably substantially equal to or less than the dividing temperature. A plurality of windows 36 are preferably bored in the piezoelectric thin film 31 to provide an etchant inlet for the removal of the sacrificial layer and a lower electrode wire outlet. A via electrode and a pad electrode are preferably formed in the lower electrode wire outlet. The windows are preferably formed by patterning of a resist by photolithography and dry etching using the resist as a mask. In the same manner as in the lower electrode material, the material of the upper electrodes 35 depends on the required physical properties of the bulk wave device.

An etchant is introduced into the sacrificial layer region 32A through the windows 36. The material of the sacrificial layer region 32A is preferably removed to form a cavity 38 of a membrane structure (FIGS. 5 and 7: S211). Wet etching or dry etching is selected based on the material of the sacrificial layer region 32A. Wet etching liquid and etching gas should not affect the piezoelectric thin film 31 and the lower and upper electrodes 34 and 35.

External terminals 39 each including a bump 17 and a solder ball 39 are then formed. A composite piezoelectric substrate including the piezoelectric thin film 31, the support layer region 32B, and the base substrate 33 is divided into a plurality of bulk wave devices 30 (FIGS. 5 and 7: S212).

Through these steps of manufacturing bulk wave devices 30, a composite piezoelectric substrate is formed. The composite piezoelectric substrate includes the piezoelectric thin film 31 on the supporting substrate including the support layer region 32B and the base substrate 33. The piezoelectric thin film 31 is preferably formed by a method for forming a piezoelectric thin film by dividing a piezoelectric substrate at an ion-implanted portion. In the bulk wave device 30 manufactured using a temporary supporting substrate that can produce a reduced thermal stress in the heating step, the piezoelectric thin film 31 has fewer defects resulting from thermal stress than conventional piezoelectric thin films. Since the sacrificial layer region 32A, the support layer region 32B, and the base substrate 33 are formed on the piezoelectric thin film 31 after the heating step, the materials of the sacrificial layer region 32A, the support layer region 32B, and the base substrate 33 can be determined without considering thermal stress in the heating step.

The supporting substrate including the support layer region 32B and the base substrate 33 is disposed on the divided surface of the piezoelectric thin film 31. Thus, the divided surface and ion-implanted surface of the piezoelectric thin film 31 are on opposite sides to those manufactured by a conventional method. An example of the operational advantage of a preferred embodiment of the present invention will be described below with reference to FIGS. 8A and 8B based on the structure of the bulk wave device 30 in which the divided surface and ion-implanted surface of the piezoelectric thin film 31 are on opposite sides to those manufactured by a conventional method.

FIG. 8A is a schematic view of a bulk wave device manufactured by a conventional method. FIG. 8B is a schematic view of a bulk wave device according to a preferred embodiment of the present invention. In both cases, ions are implanted through an ion-implanted surface A into a piezoelectric substrate 21 in an ion implantation step to form an ion-implanted portion 22. The piezoelectric substrate 21 is then divided at the ion-implanted portion 22 to form a piezoelectric thin film 31. In accordance with a conventional method, a membrane layer is formed on the ion-implanted surface A to form a cavity 38 of a membrane structure. In accordance with the present preferred embodiment of the present invention, after a temporary supporting substrate is formed on the ion-implanted surface A, a membrane layer is formed on the divided surface B to form a cavity 38 of a membrane structure.

In the piezoelectric thin film 31 formed by a method for forming a piezoelectric thin film by dividing a piezoelectric substrate at an ion-implanted portion, the collision energy of hydrogen ions and the lattice interval increase with decreasing distance from the ion-implanted surface A. Thus, the piezoelectric thin film has a concave stress on the divided surface side and a convex stress on the ion-implanted surface side. Therefore, in the bulk wave device according to the present preferred embodiment of the present invention, the ion-implanted surface bulges out away from the cavity of the membrane structure, thus causing sticking which collapses the cavity much less frequently than a bulk wave device manufactured by a conventional method. Thus, the bulk wave device according to the present preferred embodiment has a highly reliable structure.

The manufacturing method according to the second preferred embodiment is applicable to other devices having a membrane structure, such as film bulk acoustic resonator (FBAR) devices, plate wave devices, and Lamb wave devices, for example.

Third Preferred Embodiment

A method for manufacturing a gyro device including a composite piezoelectric substrate according to a third preferred embodiment of the present invention will be described below with reference to FIGS. 9 to 11. A gyro device vibrates a silicon diaphragm with a piezoelectric vibrator, and detects the Coriolis force acting on the silicon diaphragm during rotation with the piezoelectric vibrator. A method for manufacturing a tuning-fork gyro device will be described below. The tuning-fork gyro device includes a piezoelectric vibrator and a silicon diaphragm. The piezoelectric vibrator includes a piezoelectric thin film and a drive electrode. The piezoelectric vibrator is disposed on the silicon diaphragm.

Figure 9:
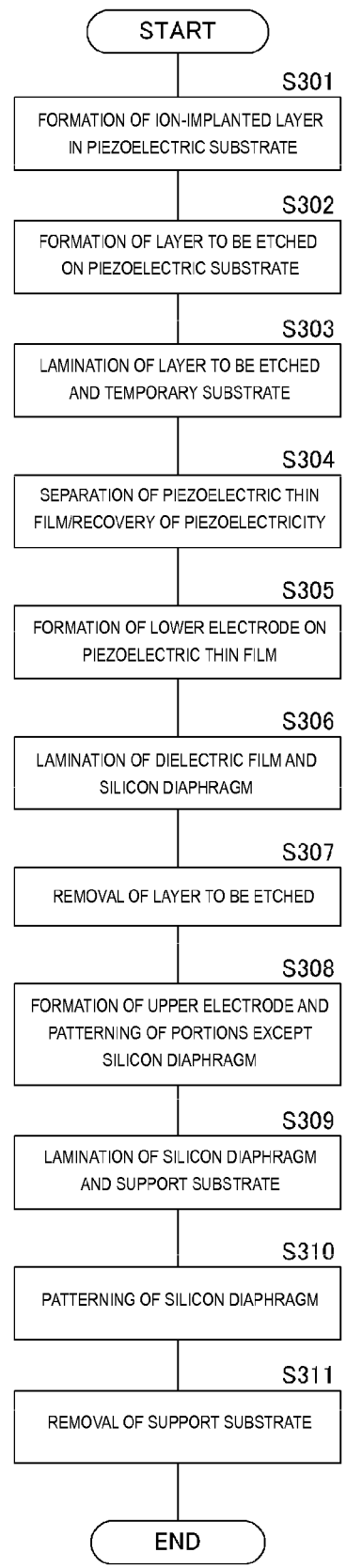
FIG. 9 is a flow chart of a method for manufacturing a piezoelectric device according to a third preferred embodiment of the present invention.

FIG. 9 is a flow chart of a portion of a method for manufacturing a gyro device according to the third preferred embodiment. FIGS. 10 and 11 are schematic cross-sectional views of manufacturing steps described in the flow chart in FIG. 9.

In substantially the same manner as in the first and second preferred embodiments, an ion implantation step is performed first (FIG. 9: S301). An etching layer forming step is then performed (FIG. 9: S302). A temporary supporting step is then performed (FIG. 9: S303). A heating step is then performed (FIGS. 9 and 10: S304). A temporary supporting substrate including a layer to be etched 43 and a temporary substrate 44 is formed on the ion-implanted surface of a piezoelectric thin film preferably having a thickness of approximately 1 μm, for example. The layer to be etched may be omitted.

The divided surface of the piezoelectric thin film 51 is preferably planarized, a lower electrode 54 to drive vibrators 50A described below are formed, and an insulating layer 56 is formed on the lower electrode 54 (FIGS. 9 and 10: S305). The insulating layer 56 defines a bonding layer between the vibrators 50A and a silicon diaphragm 50B. This step may be performed by any method at a temperature substantially equal to or less than the annealing temperature, preferably substantially equal to or less than the dividing temperature.

The material of the lower electrode 54 is selected based on on the required physical properties of the gyro device and may preferably be a high-melting-point metallic material, such as W, Mo, Ta, or Hf, a low-resistance metal, such as Cu or Al, a metallic material resistant to thermal diffusion, such as Pt, or a metallic material having good adhesion to a piezoelectric material, such as Ti or Ni, for example. The lower electrode 54 may preferably be a multilayer film including at least one of these metallic materials, for example. The insulating layer 56 may preferably be formed of silicon oxide or silicon nitride, for example.

The insulating layer 56 is then bonded to the silicon diaphragm 50B (FIGS. 9 and 10: S306). This step may be performed by any method at a temperature substantially equal to or less than the annealing temperature, preferably substantially equal to or less than the dividing temperature.

The silicon diaphragm 50B, the lower electrode 54, and the insulating layer 56 define a supporting substrate. The supporting substrate (the lower electrode 54, the insulating layer 56, and the silicon diaphragm 50B) may be made of a material having any coefficient of linear expansion without considering the thermal stress at the interface between the supporting substrate and the piezoelectric thin film 51.

The layer to be etched 43 is then etched to remove the temporary supporting substrate including the layer to be etched 43 and the temporary substrate 44 (FIGS. 9 and 10: S307). This step may be performed by any method at a temperature substantially equal to or less than the annealing temperature, preferably substantially equal to or less than the dividing temperature.

An upper electrode 55 to drive the gyro device is then formed on the ion-implanted surface of the piezoelectric thin film 51. The upper electrode 55, the piezoelectric thin film 51, and the lower electrode 54 are patterned in a predetermined shape to form the vibrators 50A (FIGS. 9 and 10: S308). This step may be performed by any method at a temperature substantially equal to or less than the annealing temperature, preferably substantially equal to or less than the dividing temperature. In substantially the same manner as in the lower electrode material, the material of the upper electrode 55 is selected based on the required physical properties of the gyro device.

The silicon diaphragm 50B is then bonded to a support substrate 57 via an adhesive (FIGS. 9 and 11: S309). This step may be performed by any method at a temperature substantially equal to or less than the annealing temperature, preferably substantially equal to or less than the dividing temperature.

The silicon diaphragm 50B is preferably dry-etched in a desired shape (tuning fork) with a fluorine-based gas, for example (FIGS. 9 and 11: S310). This step may be performed by any method at a temperature substantially equal to or less than the annealing temperature, preferably substantially equal to or less than the dividing temperature.

The support substrate 57 is then removed to form gyro devices 50 each including the vibrator 50A and the silicon diaphragm 50B (FIGS. 9 and 11: S310).

Through these steps of manufacturing the gyro devices 50, a composite piezoelectric substrate is formed. The composite piezoelectric substrate includes the vibrator 50A on the silicon diaphragm 50B. The vibrator 50A includes the piezoelectric thin film 51 formed by a method for forming a piezoelectric thin film by dividing a piezoelectric substrate utilizing an ion-implanted portion. In the gyro device 50 manufactured using a temporary supporting substrate that can produce a reduced thermal stress in the heating step, the piezoelectric thin film 51 has fewer defects resulting from thermal stress than conventional piezoelectric thin films. Since the silicon diaphragm 50B is formed on the vibrator 50A after the heating step, the material of the silicon diaphragm 50B can be determined without considering thermal stress in the heating step.

In substantially the same manner as this manufacturing method, various MEMS devices, such as radio frequency (RF) switch devices, for example, can be manufactured. MEMS devices often include a silicon substrate as a device supporting material in view of processability. Since silicon substrates generally have a smaller coefficient of linear expansion than piezoelectric substrates (piezoelectric thin films), it is difficult to heat a silicon substrate to an annealing temperature by a conventional method. In accordance with preferred embodiments of the present invention, MEMS devices including a silicon substrate as a supporting substrate can be manufactured without any problems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
    a piezoelectric thin film formed by dividing a piezoelectric substrate at a portion having a peak concentration of an ionized element implanted in the piezoelectric substrate, the piezoelectric thin film including a divided surface at which the piezoelectric thin film was divided from the piezoelectric substrate and a surface opposite to the divided surface;
    a supporting substrate disposed on a side of the divided surface of the piezoelectric thin film; and
    a functional electrode disposed on a side of the surface of the piezoelectric thin film opposite to the divided surface.

2. The piezoelectric device according to claim 1, wherein the functional electrode is an interdigital transducer electrode.

3. The piezoelectric device according to claim 1, wherein a support layer region and a cavity are disposed between the supporting substrate and the piezoelectric thin film, the support layer region enabling the piezoelectric thin film to be supported by the supporting substrate, the cavity being provided by removing a sacrificial layer region.

* * * * *